United States Patent
Hu et al.

(10) Patent No.: US 7,265,299 B2
(45) Date of Patent: Sep. 4, 2007

(54) METHOD FOR REDUCING VOLTAGE DROP ACROSS METAL LINES OF ELECTROLUMINESCENCE DISPLAY DEVICES

(75) Inventors: Shuo Hsiu Hu, Tainan (TW); Chih-Feng Sung, Miaoli (TW)

(73) Assignee: AU Optronics Corporation, Hsinchu (TW)

( * ) Notice: Subject to any disclaimer, the term of this patent is extended or adjusted under 35 U.S.C. 154(b) by 105 days.

(21) Appl. No.: 10/794,008

(22) Filed: Mar. 4, 2004

(65) Prior Publication Data
US 2005/0194179 A1  Sep. 8, 2005

(51) Int. Cl.
*H05K 1/09* (2006.01)

(52) U.S. Cl. .............. 174/257; 174/255; 174/256; 174/258; 174/261; 361/777; 361/778; 349/149; 349/150

(58) Field of Classification Search ........ 174/255–258, 174/261; 361/777, 778; 349/149, 150; 316/777, 316/778
See application file for complete search history.

(56) References Cited

U.S. PATENT DOCUMENTS

| | | | | |
|---|---|---|---|---|
| 4,775,611 A | * | 10/1988 | Sullivan | 430/314 |
| 4,931,598 A | * | 6/1990 | Calhoun et al. | 174/117 F |
| 5,742,074 A | * | 4/1998 | Takizawa et al. | 257/59 |
| 5,819,579 A | * | 10/1998 | Roberts | 72/412 |
| 6,411,272 B1 | * | 6/2002 | Edwards | 345/87 |
| 6,747,216 B2 | * | 6/2004 | Brist et al. | 174/262 |
| 6,847,114 B2 | * | 1/2005 | Sett et al. | 257/717 |
| 6,911,675 B2 | * | 6/2005 | Kato et al. | 257/86 |
| 6,919,932 B2 | * | 7/2005 | Ahn et al. | 349/42 |
| 2003/0193792 A1 | * | 10/2003 | Chang | 361/778 |
| 2005/0174518 A1 | * | 8/2005 | Koma et al. | 349/123 |

* cited by examiner

Primary Examiner—Dean A. Reichard
Assistant Examiner—Hoa C Nguyen
(74) Attorney, Agent, or Firm—Duane Morris LLP (57) ABSTRACT

A conducting device for a display device is disclosed. It comprises one or more non-conducting base lines formed in predetermined locations on a substrate layer, and one or more conducting line structures formed over the non-conducting base lines on the substrate layer, wherein the non-conducting base lines raise the conducting line structures in height for increasing a cross-sectional area thereof for reducing a resistance of the conducting line structures.

20 Claims, 5 Drawing Sheets

METHOD FOR REDUCING VOLTAGE DROP ACROSS METAL LINES OF ELECTROLUMINESCENCE DISPLAY DEVICES

BACKGROUND

The present disclosure relates generally to electroluminescence (EL) display devices, and more particularly to the design of the metal lines used within the display devices.

Typical organic electroluminescence (EL) display devices comprise a plurality of organic light emitting diode (OLED) elements (pixels) which are connected and arranged in a matrix array construction. Each OLED pixel is equipped with a switching and a driving circuit, usually comprised of capacitors and thin film transistors (TFTs) connected to scan, data and power lines. The combination of these circuits and lines serve to provide display information and power for each OLED pixel. Image display information is sent to the matrix of OLED pixels via routings of the scan, data and power lines that are connected to each OLED pixel-circuit set.

The three line types, scan, data and power, are comprised of conducting metal alloys. Conducting metal alloys featuring low resistivity material property are used as the lines to help maintain low operating resistance minimizing the voltage drop effects due to the material properties of the lines. Resistance may be defined by the following resistance equation for a solid rod or line material:

$$R = \square * L/A$$

wherein $\square\square$ is the resistivity constant for the given material, L is the length of the rod or line material, and A is the cross-sectional area of the rod or line material. The relationship of resistance to voltage is described by Ohm's Law:

$$V = R*I,$$

wherein the voltage (V) drop across a given material for a passing current (I) is dependant upon the electrical resistance (R) of the conducting material. The construction of the display device's matrix array requires metal line routings of different lengths to each OLED pixel-circuit set from the originating scan, data, and or power sources. The varying routing lengths of the metal lines effectively impose varying in-line resistance values onto the various OLED pixel-circuit sets. As a result, the delivered voltage level to the OLED pixels and their associated circuits may not be the same for all OLED pixel locations of the EL display device's matrix array.

Advanced EL display devices feature high performance image display qualities such as brightness, contrast, resolution, colors, flicker, distortion and linearity. In addition, advanced EL display devices may feature high operational refresh speeds, as well as low overall power consumption. Varying and unbalanced levels of voltage between the OLED pixel locations of such advanced EL display devices may counteract and cause undesired effects upon the image display qualities, as well as to the operational speeds and power consumption. While efforts have been made to utilize metal lines featuring low resistivity ($\square$) material, more focus is needed upon the other contributing factors (e.g.; length L and cross-sectional area A) to lower the resistance (R) of the metal lines.

What is desirable is an improved method for the fabrication of metal lines that features lower resistance throughout the different routings and lengths to the pixel locations.

SUMMARY

In view of the foregoing, this disclosure provides lower resistance conducting lines that provide lower magnitudes of voltage drops along the conducting route.

In one example, a conducting device for a display device is disclosed. It comprises one or more non-conducting base lines formed in predetermined locations on a substrate layer, and one or more conducting line structures formed over the non-conducting base lines on the substrate layer, wherein the non-conducting based lines raise the conducting line structures in height for increasing a cross-sectional area thereof for reducing a resistance of the conducting line structures.

The construction and method of operation of the invention, however, together with additional objects and advantages thereof will be best understood from the following description of specific embodiments when read in connection with the accompanying drawings.

DESCRIPTION

The present disclosure describes an improved method for the reduction of the voltage drop effects experienced by the metal lines used within EL display devices. The disclosed method provides an improved metal line structure having a higher cross-sectional area for lowering the electrical resistance of the metal lines. The improved metal line structure requires no, or minimal, change to the effective width and pitch (width and space) of the metals lines, thus requiring no, or little change, to the layout design of the associated circuits as well as to the size of the EL display devices. For simplifying the illustration, an example of one level of metal lines is used, but it is understood that the disclosed method and metal line structure is applicable to different metal line levels including the display devices' scan, data, power and any other metal lines.

Figure 1:
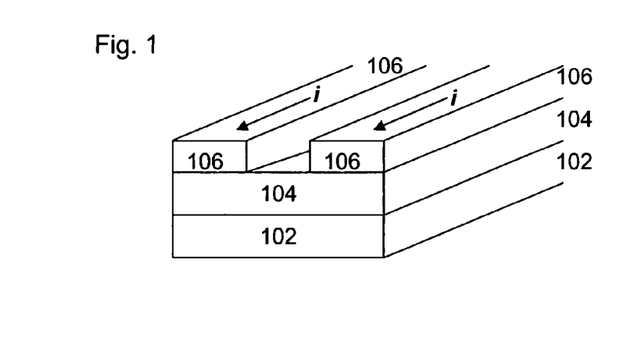
FIG. 1 illustrates a cross-sectional view of typical metal line structures of a typical organic EL display device.

Referring to FIG. 1, there is a cross-sectional view of typical metal line structures of a typical organic EL display device. The display device substrate 102 is shown comprising multiple material layers which may contain parts of or all of the primary OLED switching, driving circuits and components. A dielectric layer 104 is shown located on top of the device substrate 102 serving as an insulator between the device substrate 102 and the next layer. Two metal line structures 106 are shown having been formed and located on top of the dielectric layer 104 after the pattern and etch processing of a deposited metal layer. The arrows marked on the metal lines 106 indicate the direction of current $i$ flow through the lines. It is noted that the general shape of the cross-sectional area of the metal lines 106 are of a rectangular form. Vertical interconnection (via) structures to provide connections between the metal lines 106 and the device substrate 102, through the dielectric layer 104, may exist at certain locations of the metal lines 106 and the device substrate 102 (not illustrated).

Figure 2:
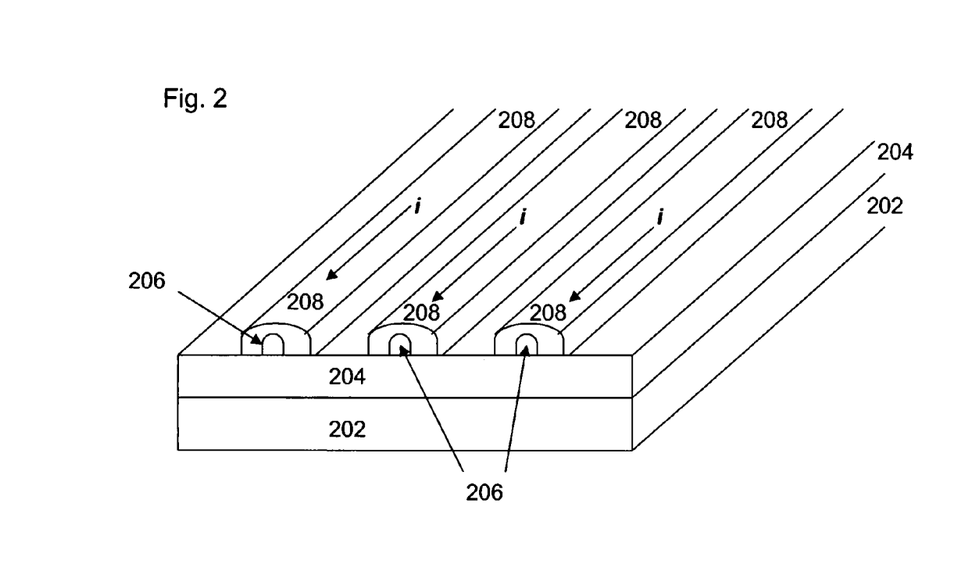
FIG. 2 illustrates a cross-sectional view of an example of metal line structures fabricated in accordance with the present disclosure.

FIG. 2 illustrates a cross-sectional view of an example of metal line structures fabricated in accordance with the present disclosure. The display device substrate 202 shown may comprise multiple material layers which may contain parts of, or all of, the primary OLED switching, driving circuits and components (see FIG. 2A). A dielectric or buffer layer 204 is shown located on top of the device substrate 202 serving as an insulator between the device substrate 202 and any layer on top thereof. The substrate 202 and the dielectric layer 204, or the dielectric layer 204 alone, may be referred to as a substrate layer for this disclosure as they together provide a flat surface for conducting lines to be formed thereon. The dielectric layer of the disclosed structure features additional dielectric areas, shaped as small bumped lines or base lines 206 located on the top surface of the dielectric layer 204. The dielectric bumped lines 206 are typically made of the same or similar material composition and properties as that of the main dielectric layer 204, i.e., they may be formed of different yet similar materials. The dielectric bumped lines 206 may be formed onto the layer during the growth or deposition of the main dielectric layer 204 or as a separate process step. The heights of the dielectric bumped lines 206 are uniform, typically creating a "step" structure to the top of the dielectric layer 204. It is understood that this height may vary, dependant upon the desired final structural dimensions of the subsequently fabricated metal lines. The cross-sectional shape of the dielectric bumped lines may not be a rectangular one, and may have other forms such as an oval, or semi-circular shape.

Figure 2A:
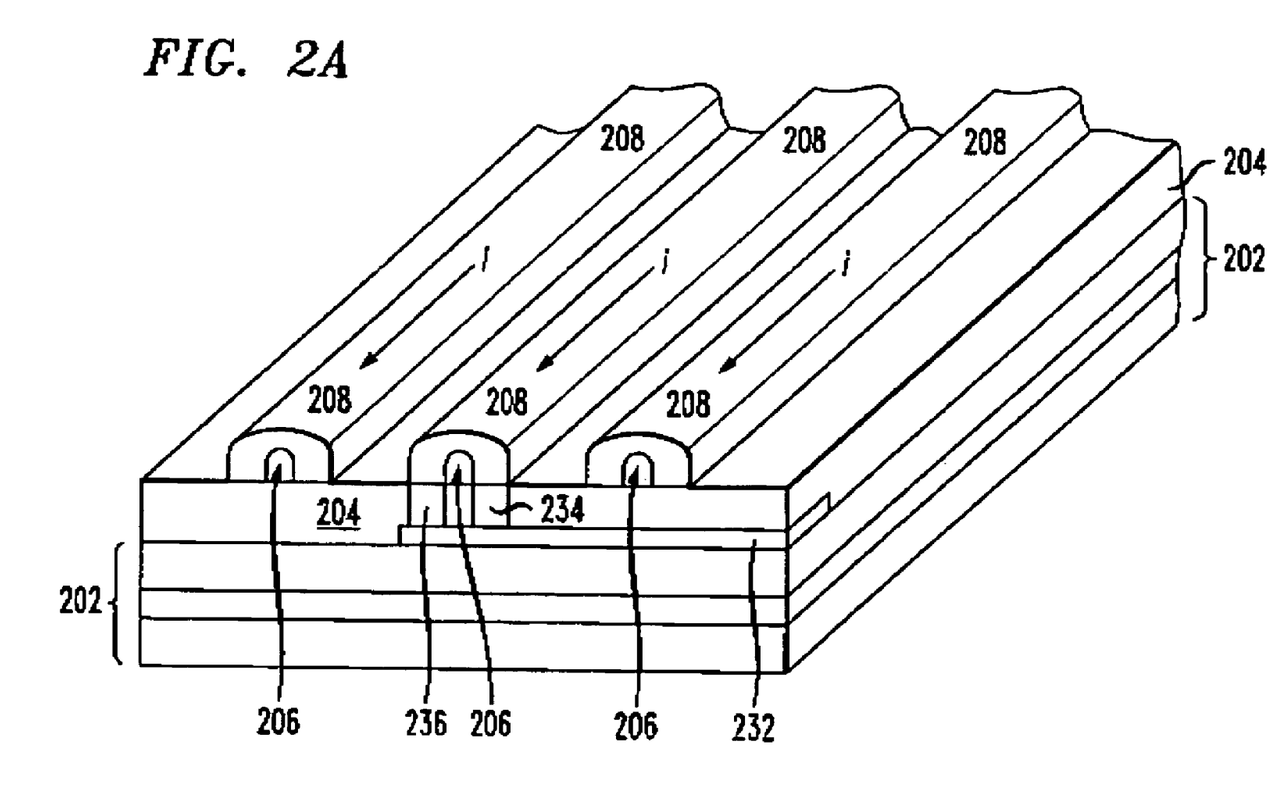
FIG. 2A illustrates a cross-sectional view of an example of metal line structures fabricated in accordance with the present disclosure and coupled to subjacent features.

FIG. 2A illustrates a cross-sectional view of an example of metal line structures fabricated in accordance with the present invention. In the illustrated embodiment of FIG. 2A, display device substrate 202 is a composite comprising multiple material layers and including component 232 may represent part of the primary OLED switching and driving circuits or a component thereof. The central metal line structure 208 is coupled to component 232 by either or both of vies 234 and 236.

The layout and locations of the dielectric bumped lines 206 may coincide with the locations of metal lines that will be subsequently formed. Three metal line structures 208 are shown having been formed and located on top of the dielectric layer 204 and dielectric bumped lines 206 after the pattern and etch processing of a deposited metal layer. It is important to note that the pattern and etch processes of the previously blanket metal layer are devised such that the formed metal lines are located and aligned with the previously formed dielectric bumped lines 206 such that the metal material is distributed evenly around each bumped line. It is further noted that three metal line structures 208 located on top of the dielectric layer 204 and 206 are formed by using pattern and etch processes for a deposited metal layer. The arrows marked on the metal lines 208 indicate the direction of current $i$ flow through the lines.

Figure 3:
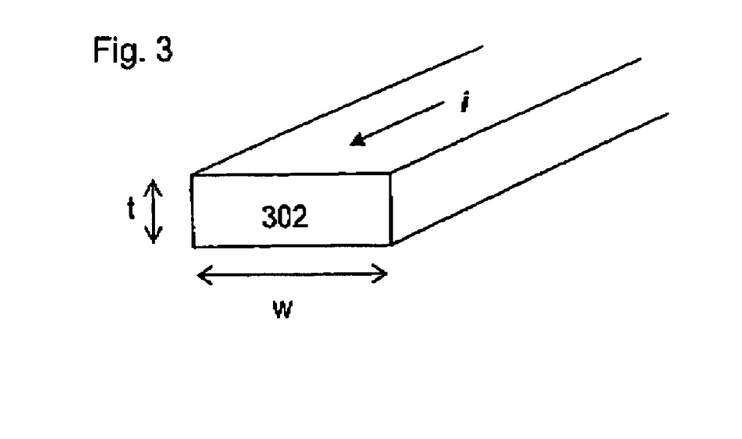
FIG. 3 illustrates a cross-sectional view of a typical metal line structure of a typical organic EL display device.

FIG. 3 illustrates a cross-sectional view of the conventional metal line that is shown as item 106 of FIG. 1. Dimensions for the cross-sectional area calculation of the metal line 302 are labeled on FIG. 3. The cross-sectional area may said to be rectangular shaped having a width and length corresponding to the FIG. 3's width w and thickness t of the metal line 302. For this example of the disclosure, if the width w of the conventional metal line 302 is 4 microns (μm), the cross-sectional area may be calculated as $A=4t$ μm².

Figure 4:
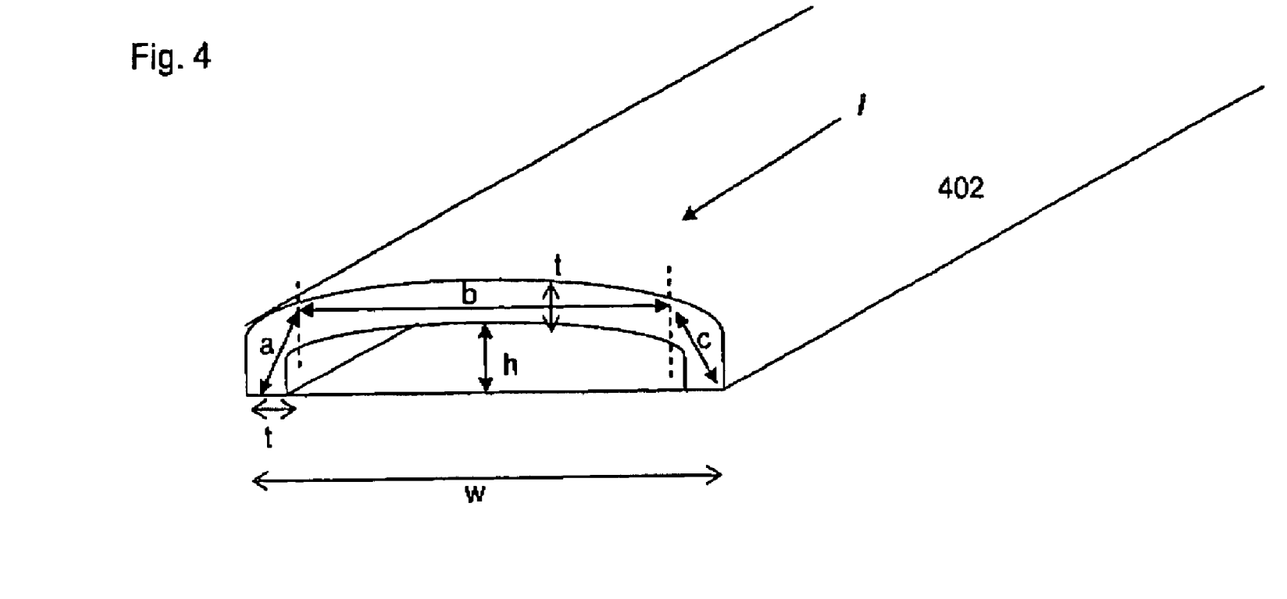
FIG. 4 illustrates a cross-sectional view of an example of a metal line structure fabricated in accordance with the present disclosure.

Referring now to FIG. 4, there is a cross-sectional view of an example of a metal line structure fabricated in accordance with the present disclosure marked with the dimensions of the metal line's cross-sectional area. Since the area cross-sectional shaped of the disclosed metal structure 402 is uniform throughout the length of the metal line with a substantially uniform thickness t of the metal across the width span, the area cross-section may be estimated by viewing the cross-sectional shape as a combination of three separate sections. The first section may be estimated to have a width of distance a, the second section a width of distance b and the third section a width of distance c, as shown on FIG. 4. For a conservative estimation, assuming that all three sections have the same thickness t, the cross-sectional area of the disclosed metal structure 402 may be loosely estimated as $$A=(a+b+c)t\mu m^2$$

For the disclosed example of FIG. 4, practical values may be assigned to the described dimensions. For a metal line structure 402 that corresponds with the same effective width w=4 μm, as that of the example for the conventional metal line 302 (FIG. 3), the values for FIG. 4's dimensions are: a=1.27 μm, b=2.20 μm and c=1.27 μm. These values are valid for the metal structure 402 that utilize a dielectric bumped line height of 0.9. μm, shown as dimension h within FIG. 4. The cross-sectional area of the metal structure 402 may now be calculated as $A=4.7t$ μm². Comparing the cross-sectional area of the disclosed metal structure 402 to that of the conventional metal line structure 302 (FIG. 3), the calculated improvement of the cross-sectional area for the disclosed metal line structure 402 is 19% or more. This improvement also translates as a corresponding portion of the resistance reduction of the disclosed metal line structure 402 compared to the conventional metal line 302. According to the resistance equation, $R=\rho * L/A$, where resistivity ρ and length L of the two compared metal line structures, 302 and 402, are the same, the resistance is reduced while the cross-sectional area is increased.

The method utilizing the metal line structure as described above in accordance with the present disclosure will help to reduce the detrimental effects of voltage drops experienced by the display elements used within organic EL display devices. The disclosed metal line structure, featuring a higher cross-sectional area than conventional metal line structures, lowers the electrical resistance of the metal lines such that voltage drops and imbalances are at insignificant levels. The improved metal line structure also features no or minimal change to the effective thickness and pitch (width and space) of the metal lines, thus requiring no or little change to the layout design of the associated circuits as well as to the size of the organic EL display devices. The disclosed method and metal line structure may be applicable for use upon the various metal line levels of the EL display device, including the scan, data, power and any other metal lines.

Figure 5A:
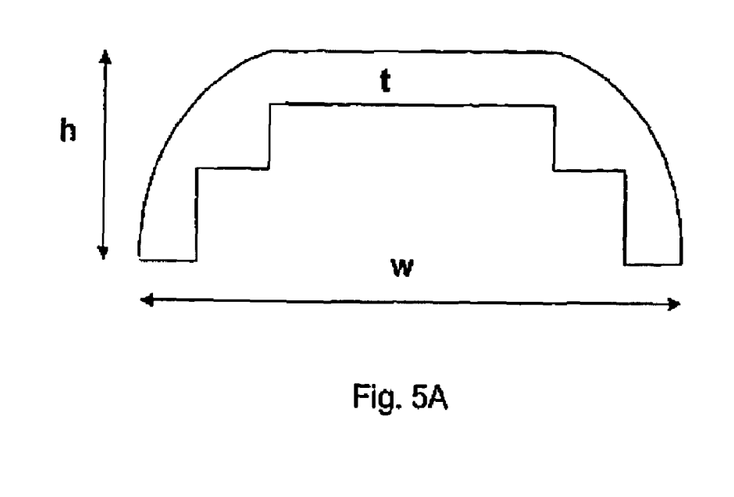
FIG. 5A-5C illustrate cross-sectional views of a metal line structure fabricated in accordance with additional examples of the present disclosure.
Figure 5B:
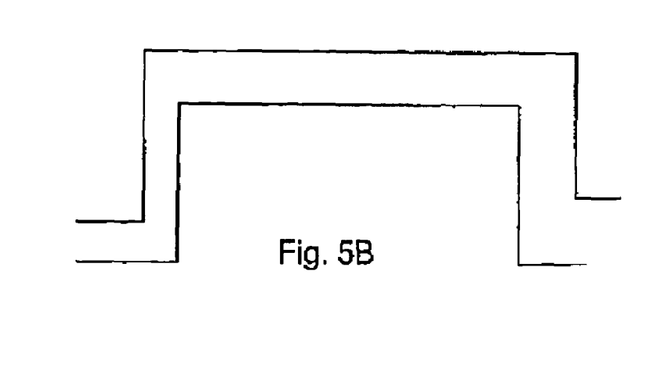
Figure 5C:
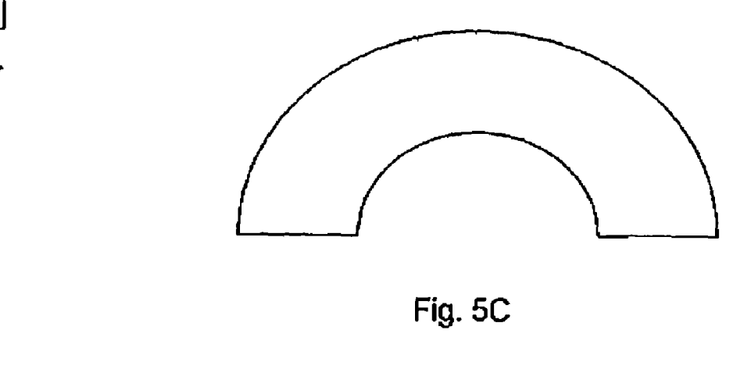

FIGS. 5A-5C provide three more cross sectional views of the metal line structure. These designs, as well as the ones illustrated above, are all intended to provide a bigger cross-sectional area than a simple rectangle of the conventional design as illustrated in FIG. 3. For the cross-sectional area, the bumped lines may have a stepped rectangular shape as illustrated in FIG. 5A, a simple rectangular shape in FIG. 5B, or a semi circular or oval shape in FIG. 5C. Due to the device size limitation, the total width w of the metal line structures may not be alterable, and due to the process requirement, the thickness t of the metal line structures may need to be maintained as the regular thickness used in the conventional design. With these two major limitations, the present disclosure provides various designs that increase the total height of the metal line structures h by having bumped lines formed underneath to create a step structure as a base for the metal line structures so that the cross sectional area of the metal line structures is increased, thereby reducing the resistance and the voltage drop across the running length thereof.

Figure 6A:
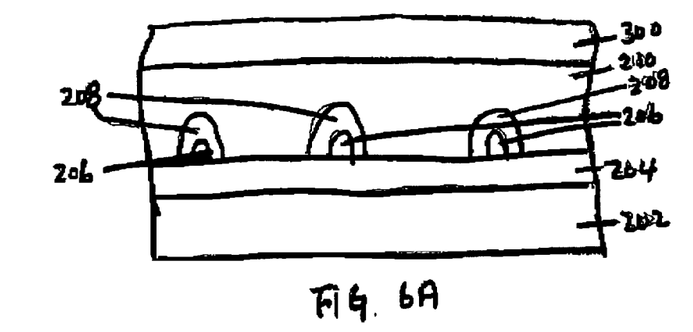
FIG. 6A illustrates a cross-sectional view of an example of metal line structures with additional metal line structures formed thereover.
Figure 6B:
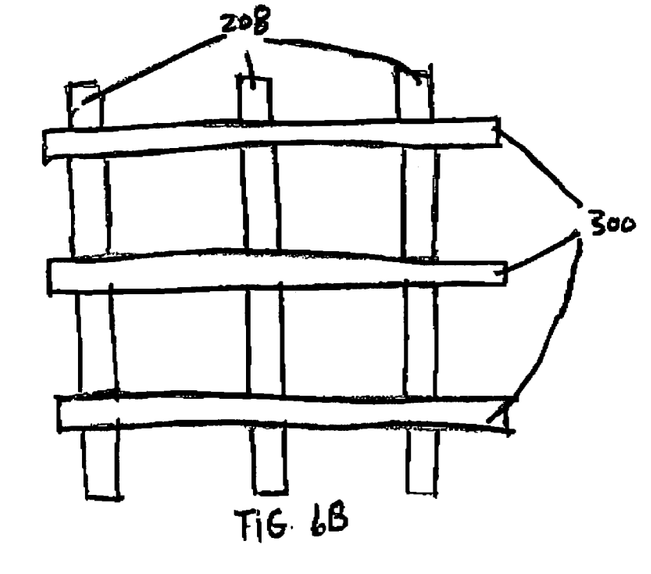
FIG. 6B illustrates a top view of an example of metal line structures of different layers arranged in different directions.

It is also understood that after a first group or first layer of metal line structures 208 are formed on the substrate layer 202, an additional insulating layer 210 can be formed on them and provides a flat surface for receiving additional conducting materials 300 as shown in FIG. 6A. In conventional semiconductor processing, multiple layers of metal lines such as 208 and 300 are formed sequentially with appropriate insulation formed therebetween. If needed, metal line structures on more than one metal layer can be formed using the above disclosed bumped lines or base lines to raise the height thereof In addition, even on a same metal layer, metal lines 208 or 300 may not be all parallel to each other. In some localized substrate areas, they may be parallel to each other, but in another area, they may be in another direction as shown in FIG. 6B. Metal lines 208 and 300 on different metal layers may be parallel or perpendicular to each other in a three dimensional sense, and may also be offset from each other with an angle as the semiconductor manufacturing technology now allows metal routing at various angles.

The disclosed method and metal line structure may be easily implemented into existing organic EL display device designs and into their fabrication operations. The method and metal line structure of the present disclosure may also be implemented into future as well as older display device technologies, but not limited to organic and EL devices. The benefits provide by the disclosed methods and metal line structures will allow for display devices of higher reliability, longer operational life and better performance quality. Such improvements will translate into significant cost improvements for a given production facility to maintain highly competitive cost and output advantages over other manufacturers of similar product devices.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for reducing voltage drop across metal lines. It is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A conducting device for a display device comprising:
   an OLED substrate including a plurality of material layers including at least one of OLED switching and driving circuits and components;
   one or more non-conducting base lines formed in predetermined locations over the substrate; and
   one or more conducting line structures formed over the non-conducting base lines and along sides of the non-conducting base lines,
   at least one of the conducting line structures coupled to a directly subjacent one of said at least one of OLED switching and driving circuits and components, through at least one vertical via,
   wherein the non-conducting base lines increase a cross-sectional area of the conducting line structures throughout the lengths thereof for reducing a resistance of the conducting line structures.

2. The conducting device of claim 1 wherein the cross-sectional area of the conducting line structure is bigger than a cross-sectional area of a conducting line structure if formed directly on the substrate without the non-conducting line formed underneath, and if both cross-sectional areas have a same width and thickness.

3. The conducting device of claim 1 wherein said at least one vertical via includes at least one said vertical via extending downwardly from each of said sides of one of the non-conducting base lines and from one of said conducting line structures.

4. The conducting device of claim 1 wherein the cross-sectional area of the non-conducting base lines has a stepped rectangular shape.

5. The conducting device of claim 1 further comprising a dielectric formed over the substrate and the non-conducting base lines formed on the dielectric and wherein the non-conducting base lines and the dielectric are formed of different materials.

6. The conducting device of claim 1 wherein the conducting line structures are aligned with the non-conducting base lines underneath so that conducting material thereof distributes evenly around the base lines to have a thickness of about 50 angstroms or more.

7. An organic luminescence display device comprising:
   a substrate area with a flat surface on an OLED substrate including a plurality of material layers including at least one of OLED switching and driving circuits and components;
   a plurality of parallel non-conducting base lines formed in predetermined locations along a first direction on the substrate area; and
   one or more metal line structures formed over the non-conducting base lines on the substrate area and along sides of the non-conducting base lines and directly over and coupled to the at least one of OLED switching and driving circuits and components,
   wherein the non-conducting base lines increase a cross-sectional area of the conducting line structures throughout the lengths thereof for reducing a resistance of the metal line structures.

8. The display device of claim 7 wherein the cross-sectional area of the metal line structure is bigger than a cross-sectional area of a metal line structure if formed directly on the substrate area without the non-conducting line formed underneath and if both cross-sectional areas having same width and thickness for the metal line structure.

9. The display device of claim 7 wherein the metal line structures are coupled to the at least one of OLED switching and driving circuits and components through at least one via.

10. The display device of claim 7 wherein the cross-sectional area of the non-conducting base lines has a stepped rectangular shape.

11. The display device of claim 7 further comprising a dielectric formed over the substrate and the non-conducting base lines formed on the dielectric and wherein the non-conducting base lines and the dielectric are formed of different materials.

12. The display device of claim 7 wherein the metal line structures are aligned with the nonconducting base lines underneath so that metal material thereof distributes evenly around the base lines with a minimum thickness of about 50 angstroms.

13. The display device of claim 7 further comprising a plurality of metal line structures formed on a predetermined substrate area having a flat surface on a further substrate, wherein the further substrate separates the metal line structures on the substrate from the metal lines on the further substrate.

14. The display device of claim 13 wherein the metal line structures formed on the substrate area are parallel to each other.

15. The display device of claim 14 wherein the metal line structures on the further substrate extend in a second direction different from the first direction.

16. The display device of claim 13 wherein the further substrate is formed directly over the metal line structures on the first substrate.

17. A metal line for an organic luminescence display device comprising:

an OLED substrate including a plurality of material layers including at least one of OLED switching and driving circuits and components;

a buffer layer formed over the OLED substrate;

a dielectric baseline formed over the buffer layer with a flat surface; and metal material evenly formed over the dielectric baseline and along sides of the dielectric baseline, the metal material coupled to a directly subjacent one of the at least one of OLED switching and driving circuits and components through at least one vertical via, wherein the metal material conforms to the baseline and has its cross-sectional area increased by the dielectric baseline.

18. The metal line of claim 17 wherein the thickness of the metal material is more than 50 angstroms.

19. The metal line of claim 17 wherein the at least one vertical via comprises at least one of the vertical vies extending from each of the respective sides of the dielectric base line and from the metal material.

20. The metal line of claim 17 wherein the dielectric baseline and the buffer layer are formed of different materials.

* * * * *

UNITED STATES PATENT AND TRADEMARK OFFICE
CERTIFICATE OF CORRECTION

PATENT NO. : 7,265,299 B2
APPLICATION NO. : 10/794008
DATED : September 4, 2007
INVENTOR(S) : Shuo Hsiu Hu et al.

It is certified that error appears in the above-identified patent and that said Letters Patent is hereby corrected as shown below:

Column 7, line 13 in Claim 12, replace "nonconducting" with --non-conducting--

Column 8, line 23 in Claim 19, replace "vies" with --vias--

Signed and Sealed this

First Day of April, 2008

JON W. DUDAS
*Director of the United States Patent and Trademark Office*